(12) United States Patent
Wang et al.

(10) Patent No.: US 11,264,823 B2
(45) Date of Patent: Mar. 1, 2022

(54) MULTI-COIL WIRELESS CHARGER

(71) Applicant: NXP USA, INC., Austin, TX (US)

(72) Inventors: Li Wang, Suzhou (CN); Dechang Wang, Suzhou (CN); Dengyu Jiang, Suzhou (CN); Huan Mao, Suzhou (CN)

(73) Assignee: NXP USA, INC., Austin, TX (US)

( * ) Notice: Subject to any disclaimer, the term of this patent is extended or adjusted under 35 U.S.C. 154(b) by 219 days.

(21) Appl. No.: 16/452,479

(22) Filed: Jun. 25, 2019

(65) Prior Publication Data
US 2020/0403436 A1 Dec. 24, 2020

(30) Foreign Application Priority Data
Jun. 20, 2019 (CN) ......................... 201910540263.4

(51) Int. Cl.
*H02J 7/02* (2016.01)
*H02J 50/40* (2016.01)
*H03K 7/08* (2006.01)
*H02J 50/23* (2016.01)

(52) U.S. Cl.
CPC ............. *H02J 7/025* (2013.01); *H02J 50/23* (2016.02); *H02J 50/40* (2016.02); *H03K 7/08* (2013.01)

(58) Field of Classification Search
USPC ....................................................... 320/108
See application file for complete search history.

(56) References Cited

U.S. PATENT DOCUMENTS

| | | | |
|---|---|---|---|
| 5,008,879 A | 4/1991 | Fischer et al. |
| 5,077,732 A | 12/1991 | Fischer et al. |
| 8,299,753 B2 | 10/2012 | Hui |
| 8,519,668 B2 | 8/2013 | Hui |
| 8,796,989 B2 | 8/2014 | Lee et al. |
| 9,059,598 B2 | 6/2015 | Kang et al. |
| 9,142,990 B2 | 9/2015 | Keeling |
| 9,413,175 B2 | 8/2016 | Park et al. |
| 9,438,067 B2 | 9/2016 | Na et al. |
| 9,590,447 B2 | 3/2017 | Knepper |
| 9,620,996 B2 | 4/2017 | Zeine et al. |
| 9,780,572 B2 | 10/2017 | Standke |
| 2009/0140691 A1 | 6/2009 | Jung |
| 2010/0151808 A1 | 6/2010 | Toncich et al. |
| 2010/0253281 A1 | 10/2010 | Li |
| 2011/0215756 A1 | 9/2011 | Shimizu |
| 2013/0127405 A1 | 5/2013 | Scherer |

(Continued)

OTHER PUBLICATIONS

U.S. Appl. No. 16/238,333; 20 pages (filed Jan. 2, 2019).

(Continued)

*Primary Examiner* — Suchin Parihar

(57) ABSTRACT

A wireless charger includes multiple transmitter coils, first and second drivers, and a controller. The transmitter coils are arranged close to and/or overlap with each other. The first driver is coupled with at least one of the transmitter coils to drive the transmitter coil to communicate with and/or provide power over a first channel to receiver devices. The second driver is coupled with at least another one of the transmitter coils to drive the transmitter coil to communicate with and/or provide power over a second channel to receiver devices. The controller is coupled with the first and second drivers and enables only one of the first and second drivers at a time during a first stage.

18 Claims, 4 Drawing Sheets

(56) References Cited

U.S. PATENT DOCUMENTS

| | | |
|---|---|---|
| 2013/0154557 A1 | 6/2013 | Lee et al. |
| 2014/0191568 A1 | 7/2014 | Partovi |
| 2015/0256226 A1 | 9/2015 | Lin et al. |
| 2015/0303699 A1* | 10/2015 | Wagman ............... H02J 50/70 307/104 |
| 2015/0326058 A1 | 11/2015 | Chu |
| 2016/0190851 A1* | 6/2016 | Pudipeddi ............ H01F 27/22 320/108 |
| 2016/0197494 A1 | 7/2016 | Kwon et al. |
| 2016/0233728 A1 | 8/2016 | Park et al. |
| 2016/0261137 A1* | 9/2016 | Riehl .................... H02J 7/025 |
| 2017/0093197 A1 | 3/2017 | Gao et al. |
| 2018/0083349 A1* | 3/2018 | Sieber ................... B60L 53/39 |
| 2018/0219403 A1 | 8/2018 | Schneider |
| 2018/0219405 A1 | 8/2018 | Qiu et al. |
| 2018/0239408 A1 | 8/2018 | Kuchibhatla et al. |
| 2018/0301933 A1 | 10/2018 | Lee |
| 2018/0323637 A1* | 11/2018 | Katabi .................. H02J 7/045 |
| 2019/0173309 A1 | 6/2019 | Jung |
| 2019/0296583 A1 | 9/2019 | So et al. |
| 2020/0021121 A1* | 1/2020 | Lee ..................... H02J 7/0036 |

OTHER PUBLICATIONS

Wireless Power Consortium; "The Qi Wireless Power Transfer System Power Class 0 Specification"; Parts 1 and 2: Interface Definitions Version 1.2.4 (Feb. 2018).

Non Final Office Action; U.S. Appl. No. 16/238,333; 9 pages (dated May 26, 2020).

Notice of Allowance; U.S. Appl. No. 16/238,333; 10 pages (dated Jul. 1, 2020).

* cited by examiner

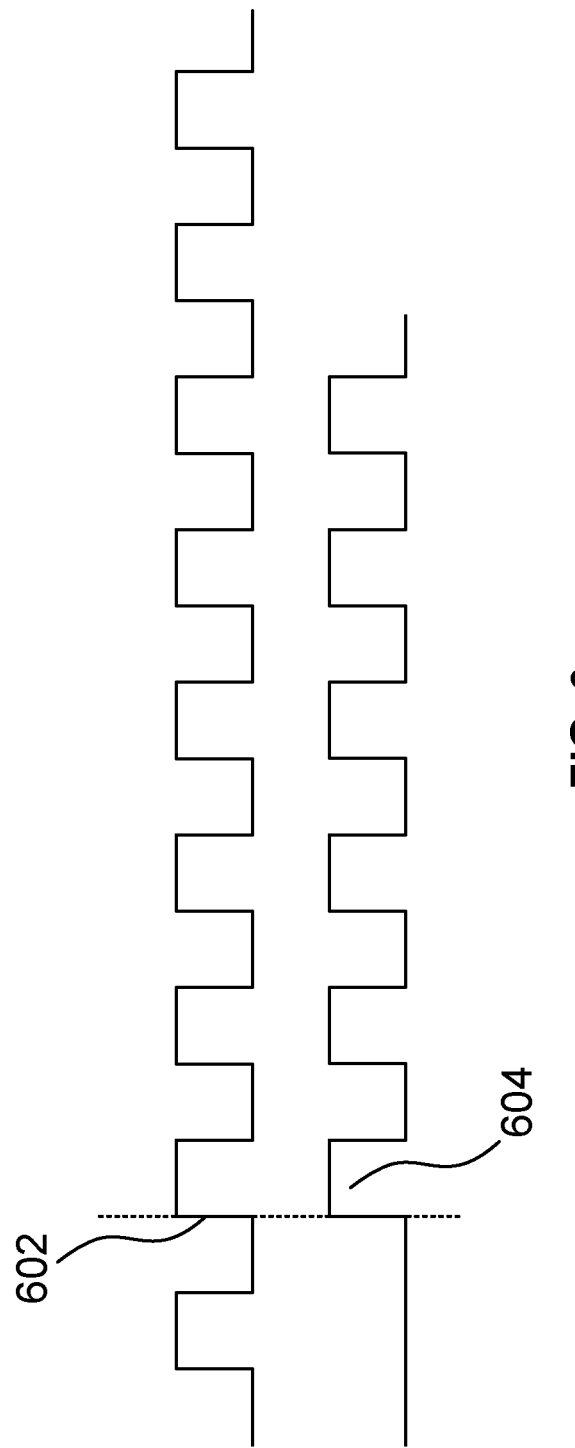

MULTI-COIL WIRELESS CHARGER

BACKGROUND

The present invention generally relates to wireless chargers and, more particularly, to avoiding inter-coil interference in a multi-coil wireless charger.

Wireless chargers are convenient because they allow electronic devices to be charged without requiring the devices to be plugged into electrical sockets. Wireless chargers have been developed that can simultaneously charge multiple devices (receivers). In operation, the receivers are placed on corresponding coils of the charger, which transmit energy to the receivers. The coils also are used for communications between the charger and the receivers. However, the coils can interfere with the communications of adjacent coils and receivers. Accordingly, it would be advantageous to manage inter-coil interference.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a wireless charger including a plurality of transmitter coils, first and second drivers, and a controller. The transmitter coils are arranged close to and/or overlap with each other. The first driver is coupled with at least one of the plurality of transmitter coils, to drive the transmitter coil coupled therewith to communicate with and/or provide power to one or more receiver devices in a first channel. The second driver is coupled with at least another one of the plurality of transmitter coils, to drive the transmitter coil coupled therewith to communicate with and/or provide power to one or more of the receiver devices in a second channel. The controller is coupled with the first and second drivers and enables only one of the first and second drivers at the same time during a first stage.

In another embodiment, the present invention provides a wireless charger including multiple transmitter coils and a controller. The transmitter coils communicate with and transmit power to receiver devices. The transmitter coils include at least a first transmitter coil and a second transmitter coil that overlap each other. The controller is coupled with the multiple transmitter coils. In response to the first transmitter coil transmitting signals, the controller mutes the second transmitter coil.

In yet another embodiment, the present invention provides a wireless charger including multiple transmitter coils and a controller. The transmitter coils are arranged in an array and communicate with and/or provide power to receiver devices. The controller is coupled with the multiple transmitter coils. The controller generates FSK data packets from PWM signals, and drives the transmitter coils to transmit the FSK data packets to communicate with the receiver devices. The controller synchronizes the PWM signals for the multiple transmitter coils by causing a rising edge of the PWM signal for one of the multiple transmitter coils to occur after an FSK data packet is transmitted to be the same time as rising edges of the PWM signals for other transmitter coils.

BRIEF DESCRIPTION OF THE DRAWINGS

So that the manner in which the above recited features of the present invention can be understood in detail, a more detailed description of the invention may be had by reference to embodiments, some of which are illustrated in the appended drawings. The appended drawings illustrate only typical embodiments of the invention and should not limit the scope of the invention, as the invention may have other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

FIG. 6 is a timing diagram of the PWM signals for different communication channels in accordance with an exemplary embodiment of the present invention.

DETAILED DESCRIPTION

Figure 1:
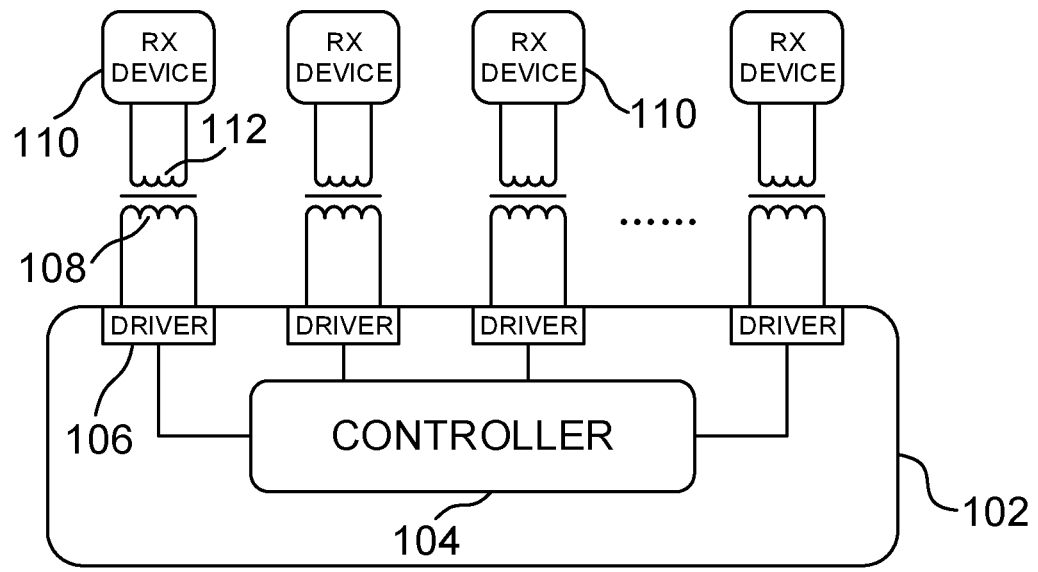
FIG. 1 is a schematic block diagram of a wireless charger according to an exemplary embodiment of the present invention.

FIG. 1 is a schematic block diagram of a wireless charger 102 including multiple transmitters that support charging multiple receiver devices 110. The wireless charger 102 includes a controller 104, multiple drivers 106, and multiple transmitter coils 108 connected to corresponding ones of the multiple drivers 106. The controller 104 controls the multiple drivers 106 to drive the corresponding transmitter coils 108. The controller 104 may comprise a single controller circuit that manages the coils 108 or multiple controller circuits, each of which manages a respective one of the coils 108. Each transmitter coil 108 and the corresponding driver 106 form a transmitter that generates wireless charging power. By having multiple transmitter coils 108 (i.e., multiple transmitters), the wireless charger 102 is able to simultaneously charge multiple receiver devices 110. Each receiver device 110 includes a receiver coil 112 that couples with one of the transmitter coils 108 to both receive power from and communicate with the wireless charger 102. The wireless charger 102 communicates with the receiver device 110 using, for example, an in-band ASK (Amplitude Shift Keying) communication scheme.

Figure 2:
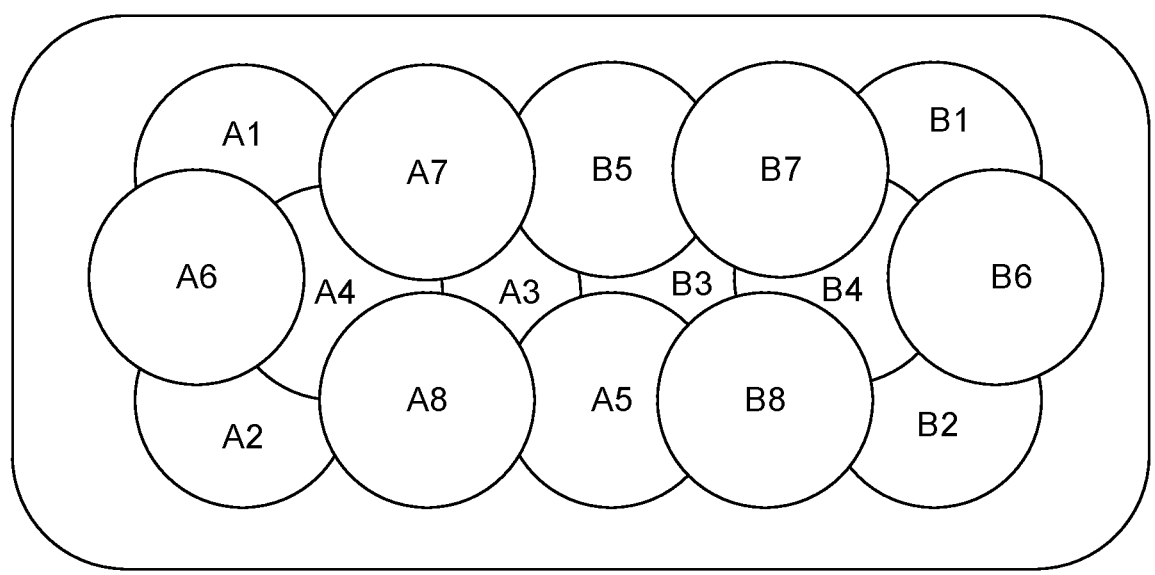
FIG. 2 is a top plan view of the multiple transmitter coils of FIG. 1.

In a preferred embodiment, one driver 106 of the transmitter is coupled with multiple transmitter coils 108 to cover a large area so a receiver placed within the large area will be paired and charged. FIG. 2 is a top plan view of the multiple transmitter coils 108 arranged in an array. The transmitter coils A1-A8 and B1-B8 are coupled with two of the drivers 106, where transmitter coils A1-A8 are coupled with a first driver to communicate over a first channel, and transmitter coils B1-B8 are coupled with a second driver to communicate over a second channel. The transmitter coils A1-A8 and B1-B8 are arranged to be close to each other, or overlapping, to provide seamless coverage for receiver devices. For example, the transmitter coil A7 overlaps with the transmitter coil A4, which overlaps with the transmitter coil A3. Further, transmitter coils coupled to different drivers 106 overlap, like in FIG. 2, transmitter coil B8 overlaps with coil A5, which overlaps with coil B3.

When a receiver device is placed over the coils A1-A8 and B1-B8, the receiver device can couple with multiple ones of the coils and thus couple with more than one of the drivers 106 such that the receiver device may receive signals from the coils to which it is coupled. The signals from the multiple communication channels can cause the receiver device to operate unstably, resulting in in-band communication interference and abnormal charging behaviors.

Overlapping coils that are connected to different drivers may interfere with each other due to mutual inductances because the channel communications start at random times and have phase differences. The interferences with coils in respective channels can cause rail voltage fluctuations that can harm the transmitter. In applications where FOD (foreign object detection) is performed through calculation of power losses, the interferences in the coils can result in incorrect FODs.

According to an embodiment of the present invention, the controller 104 controls the drivers 106 to drive the transmitter coils 108 to conduct at least first and second stage communications, before power signals are provided. In typical wireless charging protocols such as the Qi protocol, the transmitter coils transmit ping signals in the first stage to determine if a receiver device is present in its operation range. The ping signals include digital ping (DP) signals applied in a "ping period", and analog ping (AP) signals applied in a "protection period" that are less power consuming than the DP signals. The transmitter coils transmit communication signals in the subsequent second stage, after the receiver is determined to be present, to configure the communication with the detected receiver device. In the Qi protocol, the communication signals from the transmitter to the receiver device are configured as data packets that are FSK-modulated from PWM (power width modulation) signals.

In an exemplary embodiment of the present invention, the controller 104 enables only one of the drivers 106 at a time during the first stage. More specifically, during the first stage, the controller 104 allows the transmitter coils 108 coupled with the enabled driver 106 to transmit first signals and, at the same time, the controller 104 mutes the transmitter coils 108 coupled with the other drivers 106. Receiver devices, in response to the first signals from the transmitter coils 108, transmit response signals back to the wireless charger 102.

Upon correctly receiving the response signals, the wireless charger 102 determines to enter the second stage, and determines a transmitter coil, which is one of the transmitter coils 108 coupled with the enabled driver 106, to transmit second signals to communicate with the receiver device that transmitted the response signals. The second signals are used for pairing the transmitter coil and the receiver device, and for configuring the transmitter to prepare for power transmission. After the pairing and configuration, the transmitter coil 108 is driven to start providing a power signal to charge the receiver device. At the same time, the transmitter coils 108 that overlap the working transmitter coil are disabled. To better avoid interference, the transmitter coils 108 immediately adjacent the working transmitter coil are disabled. Here "immediately adjacent" means either overlapping or very close. For example, in FIG. 2, transmitter coil B5 is immediately adjacent transmitter coil A3 because they overlap, while coil A5 also is immediately adjacent to transmitter coil B5 because they are very close to each other. Accordingly, the disabled transmitter coils can either be coupled with the same or a different driver as the working transmitter coil.

Figure 3:
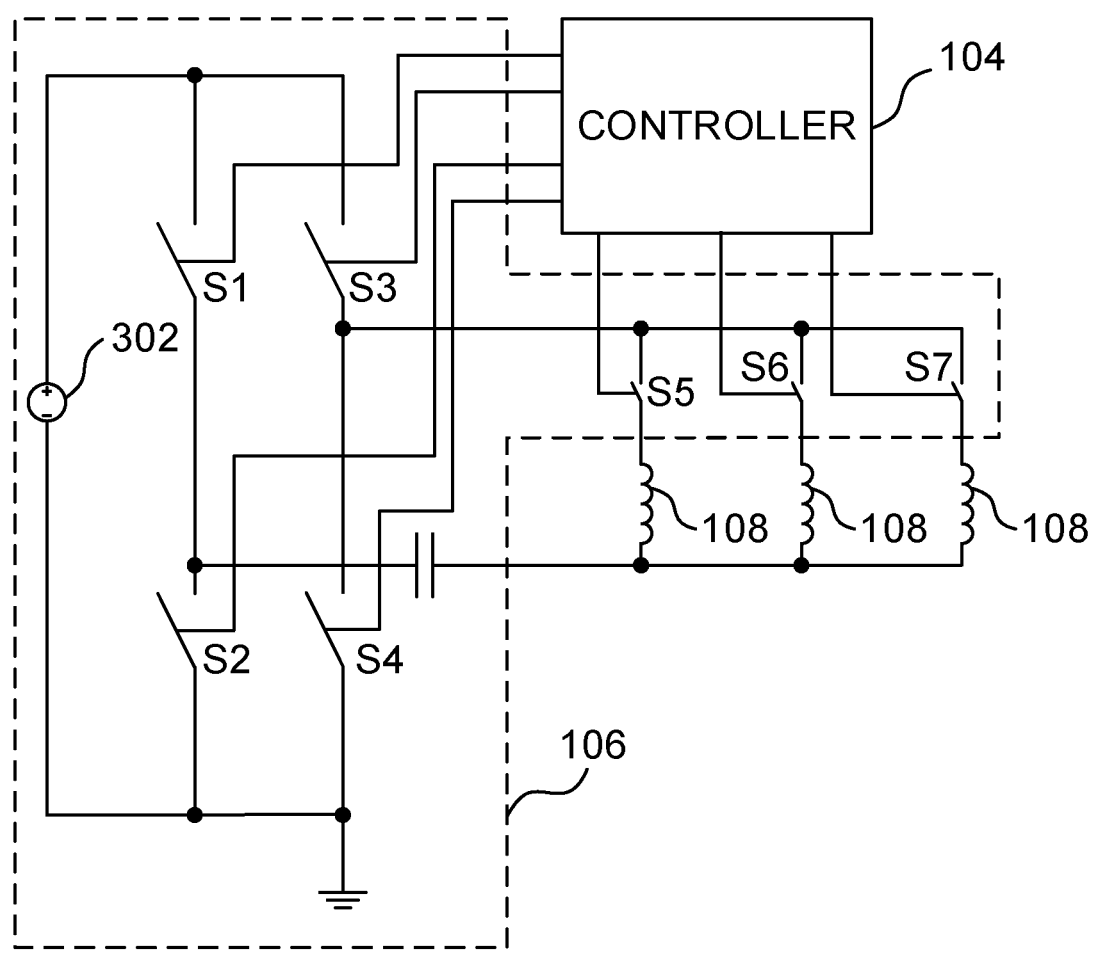
FIG. 3 is a circuit diagram of the controller, the driver, and the multiple transmitter coils of FIG. 1.

FIG. 3 is a circuit diagram of the controller 104, the driver 106, and multiple transmitter coils 108 that are connected to the driver 106. The multiple transmitter coils 108 connected to the driver 106 communicate over the same channel. The driver 106 includes a voltage supply 302, which provides a supply voltage, typically a DC voltage. The driver 106 further includes a bridge circuit, which includes four switches S1, S2, S3, and S4 such that the bridge circuit is implemented as a full bridge. In alternative embodiments, the bridge circuit has only two switches and is implemented as a half bridge. The supply voltage is provided to the bridge circuit. Accordingly, the bridge circuit generates signals, as described above, ping signals, communication signals, and power signals, and provides such signals to the transmitter coils 108. The switches S1 to S4 are controlled by the controller 104 with individual control signals.

The driver 106 further includes switches S5, S6, and S7 that are connected between the bridge circuit and the transmitter coils 108. Each of the switches S5-S7 is connected to a corresponding one of the transmitter coils 108. The switches S5-S7 receive control signals from the controller 104. According to an embodiment of the present invention, in transmitting the second signals and the power signals, the transmitter coils coupled to the same communication channels, i.e., coupled with the same driver 106, as the working transmitter coil 108, are also muted, for example by opening corresponding ones of the switches S5 to S7 connected to the transmitter coils to be muted.

Figure 4:
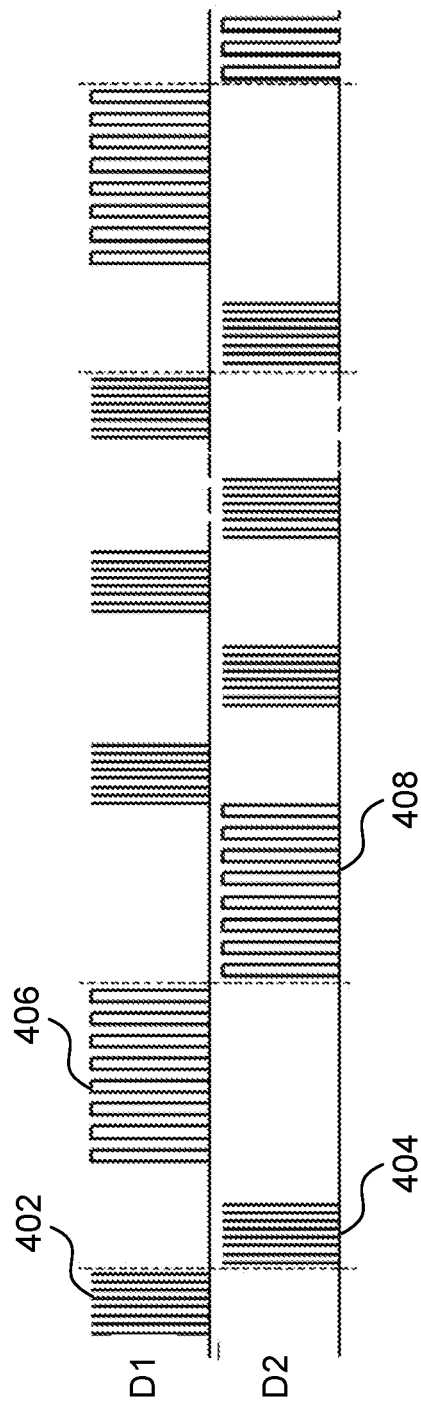
FIG. 4 is a timing diagram of first signals transmitted by transmitter coils of a first and a second communication channel according to an exemplary embodiment of the present invention.

Referring to FIG. 4, which is a timing diagram of first signals transmitted by transmitter coils of first and second communication channels, according to an embodiment of the present invention. D1 shows the first signals transmitted by transmitter coils of the first channel during the first stage, and D2 shows the first signals transmitted by transmitter coils of the second channel during the first stage. In an embodiment of the present invention that conforms to the Qi protocol, pulses 402 represent the AP signals transmitted by the transmitter coils 108 of the first channel during the first stage, and pulses 404 represent the AP signals transmitted by the transmitter coils 108 of the second channel during the first stage.

The switches S5 to S7 connected to the same communication channel are closed in an alternate manner, to alternately couple the corresponding transmitter coils 108 with the bridge circuit. It will be understood by those of skill in the art that the transmitter coil 108 transmits signals when the corresponding one of the switches S5 to S7 is turned on. In other words, for the communication channels D1 and D2, their respective switches S5 to S7 for coupling the transmitter coils 108 are controlled such that only one switch is turned on at any one time.

The pulses 406 represent the DP signals (of the Qi protocol) transmitted by the transmitter coils 108 of the first channel during the first stage, and pulses 408 represent the DP signals transmitted by the transmitter coils 108 of the second channel during the first stage. As can be seen from FIG. 4, only one communication channel (either D1 or D2) is allowed to transmit signals at a time, and the other communication channels are controlled to be mute. For the whole of the wireless charger 102, at a given time, only a working one of the transmitter coils 108, regardless of the communication channel such working transmitter coil is coupled, transmits signals. The controller 104 as such enables only one transmitter coil at a time to avoid interference. It is shown in the embodiment of FIG. 3 that the transmitter coils 108 are connected to or disconnected from the bridge circuit through the respective switches S5-S7. In alternative embodiments, the controller 104 can use other ways to enable/disable the drivers 106 and/or mute/unmute the transmitter coils 108.

In alternative embodiments, different communication channels can use their corresponding transmitter coils to transmit signals at the same time to improve efficiency. For example, referring to FIG. 2, when the transmitter coil A6 is transmitting the first signal, the transmitter coil B8, which does not overlap with or is not immediately adjacent to coil A6, also transmits signals. Since the transmitter coils A6 and B8 do not overlap with each other, there is a low risk of significant mutual interferences that would deteriorate performance of the wireless charging.

If each of the communication channels are controlled to operate at the same time (except for the immediately adjacent transmitter coils, which are enabled only one at a time) driving their corresponding transmitter coils to transmit signals, the PWM signals are converted to FSK-modulated data and formed into data packets can initially have random starting times, since the communications with the receiver devices are initiated at random times. The random starting times of the PWM signals indicate phase differences. On the other hand, during the FSK modulation, phases of the PWM signals will be shifted and, amongst different communication channels using their respective PWM signals, cause phase shifts in the PWM signals.

Figure 5:
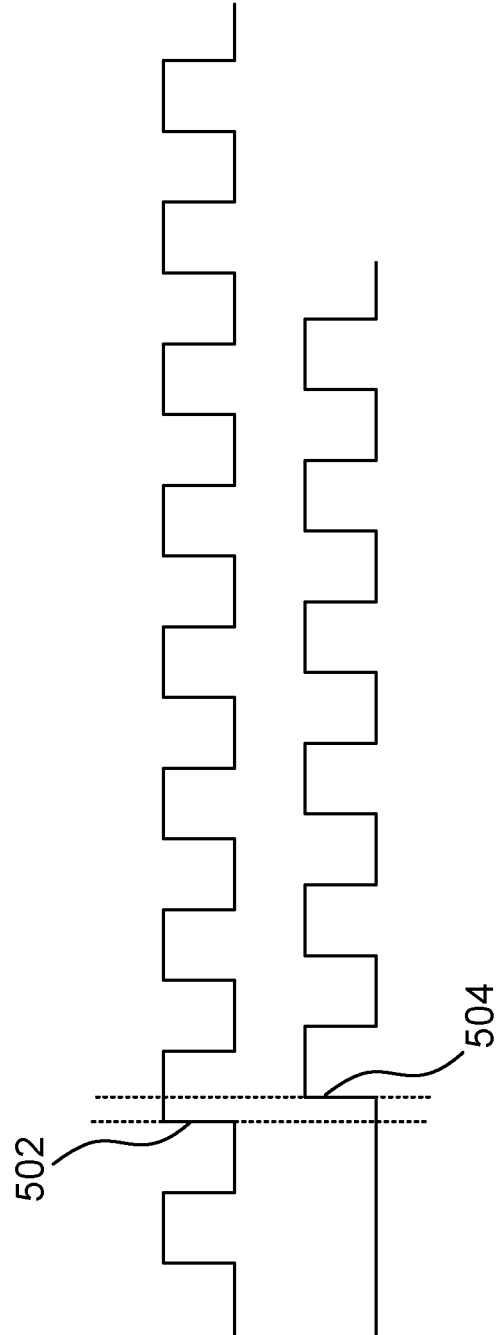
FIG. 5 is a timing diagram of the PWM signals for different communication channels showing phase differences in accordance with an embodiment of the present invention.

FIG. 5 shows the phase differences of the PWM signals for different communication channels. In FIG. 5, a rising edge 502 of the PWM signal for the first communication channel D1 occurs before a rising edge 504 of the PWM signal for the second communication channel D2, which indicates a phase difference. The phase differences in the PWM signals may result in interference through mutual induction of the transmitter coils.

In an embodiment of the present invention as depicted in FIG. 6, the controller 104 synchronizes the PWM signals that are provided for the different communication channels. More specifically, the controller 104 synchronizes the rising edges of the PWM signals to eliminate the phase differences. As can be seen from FIG. 6, a rising edge 602 of the PWM signal for the first communication channel D1 occurs concurrently with a rising edge 604 of the PWM signal for the second communication channel D2. In operation, when a communication channel is about to send out power signals to a coupled receiver device, the PWM signal for such communication channel is controlled by the controller 104 to be synchronized with the PWM signal for other communication channels. After a communication channel finishes sending the FSK-modulated data packets and the phase difference occurs, the controller 104 synchronizes the PWM signal for this communication channel such that the rising edge of the PWM pulse occurs at the rising edges of the other PWM signals.

Accordingly, in one embodiment of the present invention, the PWM signals are synchronized by, for first and second unmuted transmitter coils 108 (typically with different respective communication channels) other than those muted transmitter coils (immediately adjacent the working transmitter coils), after the first unmuted transmitter coil finishes transmitting the FSK data packet and/or at the beginning of when the first unmuted transmitter coil starts to transmit power signals, the rising edge of the PWM signal provided for the first unmuted transmitter coil is set to be at the same time as the rising edge of the PWM signal provided for the second unmuted transmitter coil.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements, although typically coupled can include an inductive connection, where connected typically means connected such as with a wire. Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A wireless charger, comprising:
  a plurality of transmitter coils arranged close to and/or overlapping with each other;
  a first driver coupled with a first one of the plurality of transmitter coils, configured to drive said transmitter coil to communicate with and/or provide power over a first channel to a first receiver device;
  a second driver coupled with a second one of the plurality of transmitter coils, to drive the second one of the transmitter coils configured to communicate with and/ or provide power over a second channel to a second receiver device;
  a controller connected to the first and second drivers, wherein the controller is configured to enable only one of the first and second drivers at a time;
  wherein the controller is configured to synchronize PWM signals that are provided for transmitter coils coupled with different drivers.

2. The wireless charger of claim 1,
wherein an enabled driver is the first driver;
wherein the controller is configured to,
- allow the first one of the transmitter coils coupled with the enabled driver to transmit first signals, and
- mute the second one of the transmitter coils coupled with the second driver at the same time.

3. The wireless charger of claim 1,
wherein an enabled driver is the first driver;
wherein, in response to a received signal from the first receiver device during a first stage, the controller is configured to
- drive the first one of the transmitter coils coupled with the enabled driver to transmit second signals to communicate with and/or provide power to the first receiver device during a second stage, and
- disable the second one of the transmitter coils that are immediately adjacent the first one of the transmitter coils.

4. The wireless charger of claim 3,
wherein the controller is configured to disable other transmitter coils that are connected to the first driver during the second stage.

5. The wireless charger of claim 3,
wherein the first one of the transmitter coils and a set of disabled transmitter coils that are immediately adjacent the first one of the transmitter coils are coupled to different drivers.

6. The wireless charger of claim 1,
wherein the controller is configured to provide a first PWM signal to the first one of the transmitter coils coupled with the first driver and a second PWM signal to the second one of the transmitter coils coupled with the second driver.

7. The wireless charger of claim 6,
wherein the controller synchronizes the PWM signals by controlling a rising edge of the first PWM signal to coincide with a rising edge of the second PWM signal.

8. The wireless charger of claim 7,
wherein the controller is further configured to use the PWM signals to generate power signals and data packets to be communicated by the transmitter coils.

9. The wireless charger of claim 8,
wherein the controller is further configured to control the rising edge of the first PWM signal at a beginning of the power signal to be at the rising edge of the second PWM signal.

10. The wireless charger of claim 8,
wherein the controller is further configured to control the rising edge of the first PWM signal at an end of the data packet to be at the rising edge of the second PWM signal.

11. A wireless charger, comprising:
multiple transmitter coils configured to communicate with and transmit power to a first receiver device and a second receiver device,
wherein the multiple transmitter coils comprise at least a first transmitter coil and at least a second transmitter coil that overlaps the first transmitter coil; and
a controller coupled with the multiple transmitter coils,
wherein the controller is configured to, in response to the first transmitter coil transmitting signals to the first device, mute the second transmitter coil coupled to the second device while the first transmitter coil is transmitting to the first device; and
wherein the multiple transmitters are configured to transmit FSK data packets generated by modulating PWM signals, and to transmit power signals.

12. The wireless charger of claim 11,
wherein the first and second transmitter coils are coupled with different drivers to communicate over different channels.

13. The wireless charger of claim 11,
wherein the controller is configured to, in response to each FSK data packet being transmitted by a first one of unmuted transmitter coils other than the muted second transmitter coil, synchronize the PWM signals provided for the unmuted transmitter coils by:
configuring a first PWM signal provided for the first one of the unmuted transmitter coils such that a rising edge of the first PWM signal is at the same time as rising edges of the PWM signals provided for the other unmuted transmitter coils.

14. The wireless charger of claim 11,
wherein the controller is configured to synchronize the PWM signals provided for unmuted transmitter coils other than the muted second transmitter coil by:
at a beginning of a first one of the unmuted transmitter coils transmitting the power signal, configuring a rising edge of a first PWM signal provided for the first one of the unmuted transmitter coil to be at the same time as rising edges of the PWM signals provided for the other unmuted transmitter coils.

15. A wireless charger, comprising:
multiple transmitter coils that are arranged in an array and configured to communicate with and/or provide power to a first receiver device and a second receiver device;
a controller coupled with the multiple transmitter coils,
wherein the controller is configured to generate FSK data packets from PWM signals, and drive the multiple transmitter coils to transmit the FSK data packets to communicate with the first and second receiver devices;
wherein the controller is configured to synchronize the PWM signals respectively sent to the multiple transmitter coils by synchronizing a rising edge of the PWM signal for a first one of the multiple transmitter coils configured to be coupled to the first receiver device after an FSK data packet is transmitted with a rising edge of the PWM signals for a second one of the multiple transmitter coils configured to be coupled to the second receiver device;
wherein only one of the first and second receiver devices communicates with and/or receives power at a time.

16. The wireless charger of claim 15,
wherein the controller is further configured to synchronize the PWM signals respectively provided for the multiple transmitter coils by controlling a rising edge of the PWM signal for one of the multiple transmitter coils to occur before a power signal is started to be the same time as rising edges of the PWM signals for other transmitter coils.

17. The wireless charger of claim 15,
wherein the second one of the multiple transmitter coils overlaps the first one of the multiple transmitter coils; and
wherein the wireless charger further comprises:
- a first driver coupled with the first one of the multiple transmitter coils to drive the first one of the multiple transmitter coils to communicate over a first channel; and a second driver coupled with the second one of the multiple transmitter coils to drive the second one of the multiple transmitter coils to communicate over a second channel, wherein the controller is further configured to control the first driver to drive the first one of the multiple transmitter coils to communicate signals and simultaneously control the second driver not to drive the second one of the multiple transmitter coils to communicate signals.

18. The wireless charger of claim 15, wherein the second one of the multiple transmitter coils that overlaps the first one of the multiple transmitter coils, wherein the wireless charger further comprises:
 a first driver coupled with the first one of the multiple transmitter coils and the second one of the multiple transmitter coils to drive the first one of the multiple transmitter coils and the second one of the multiple transmitter coils to communicate over a first channel, wherein the controller is configured to drive the first one of the multiple transmitter coils and the second one of the multiple transmitter coils to alternately communicate signals.

\* \* \* \* \*